United States Patent
Yasui et al.

(10) Patent No.: US 6,221,773 B1
(45) Date of Patent: Apr. 24, 2001

(54) METHOD FOR WORKING SEMICONDUCTOR WAFER

(75) Inventors: Kan Yasui, Kokubunji; Shigeo Moriyama, Tama; Katsuhiko Yamaguchi, Hachioji; Yoshio Homma, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/254,431

(22) PCT Filed: Sep. 13, 1996

(86) PCT No.: PCT/JP96/02634

§ 371 Date: Mar. 9, 1999

§ 102(e) Date: Mar. 9, 1999

(87) PCT Pub. No.: WO98/11600

PCT Pub. Date: Mar. 19, 1998

(51) Int. Cl.[7] ................................................ H01L 21/302
(52) U.S. Cl. .................... 438/690; 438/691; 438/692; 438/693; 438/759; 438/959
(58) Field of Search ........................... 438/631, 633, 438/690–692, 693, 759, 928, 959, 964, 974, 977

(56) References Cited

U.S. PATENT DOCUMENTS 5,462,635 * 10/1995 Ono et al. ............................ 438/690
5,747,385 * 5/1998 Torii ..................................... 438/690
6,114,245 * 9/2000 Vandamme et al. ................. 438/690

FOREIGN PATENT DOCUMENTS

| 54-81591 | 6/1979 | (JP) . |
| 56-134170 | 10/1981 | (JP) . |
| 60-25649 | 2/1985 | (JP) . |
| 469161 | 3/1992 | (JP) . |

* cited by examiner

*Primary Examiner*—Jey Tsai
*Assistant Examiner*—Lynne A. Gurley
(74) *Attorney, Agent, or Firm*—Antonelli, Terry, Stout & Kraus, LLP

(57) ABSTRACT

A method for processing semiconductor wafers, which provides planarized surface in a well controllable manner and with high accuracy by processing a film with uneven surface, formed over a semiconductor wafer, within the area of a working surface with a diameter larger than that of said semiconductor wafer by not more than two times, and by processing the film with a polishing liquid supplied from a supply unit disposed on a vertically arranged working surface is disclosed. Additionally, high quality dressing of the working surface can be easily performed by virtue of the smaller diameter of the working surface. Furthermore, the vertical arrangement of the working surface makes possible ready compatibility with semiconductor wafers of enlarged diameters.

16 Claims, 11 Drawing Sheets

Fig. 6

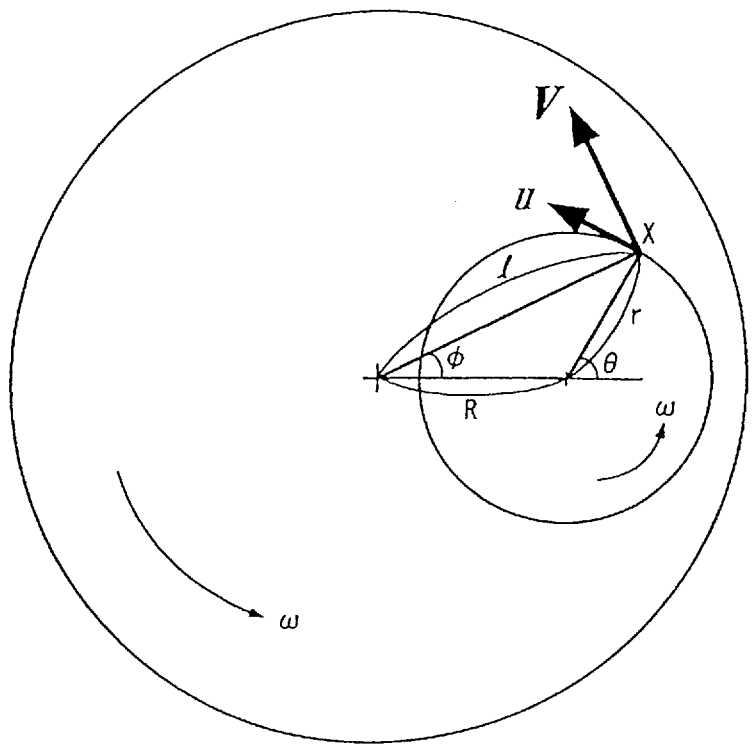

$$\begin{cases} \vec{V} = (-l\omega\sin\varphi,\ l\omega\cos\varphi) \\ \vec{u} = (-r\omega\sin\theta, r\omega\cos\theta) \end{cases}$$

$$V \equiv |\vec{V} - \vec{u}|^2$$

$$= (-r\omega\sin\theta + l\omega\sin\varphi)^2 + (r\omega\cos\theta - l\omega\cos\varphi)^2$$

$$= \omega^2\left[r^2 + l^2 - 2rl\cos(\theta - \varphi)\right]$$

$$\begin{pmatrix} l^2 = R^2 + r^2 + 2rR\cos\theta & \cdots \text{According to the cosine rule} \\ l\cos\varphi = R + r\cos\theta & \cdots \text{Obvious from the figure} \end{pmatrix}$$

$$= \left\{2r^2 + R^2 + 2rR\cos\theta - 2r\left[(R + r\cos\theta)\cos\theta + r\sin^2\theta\right]\right\}^2$$

$$= R^2\omega^2$$

$$\therefore V = R\omega$$

METHOD FOR WORKING SEMICONDUCTOR WAFER

BACKGROUND OF THE INVENTION

This invention relates to a method for manufacturing semiconductor integrated circuit devices, and more particularly to a preferred processing method for the planarization of film that is formed to cover semiconductor wafers whose surface is uneven.

This invention can be applied to the manufacturing of semiconductor devices because it allows films with uneven surface, formed over semiconductor wafer surface, to be planarized efficiently.

Semiconductor devices are manufactured through such treatments as the doping of active impurities into the inside of semiconductor wafers, formation of various kinds of film on wafers, and etching. Recently, as semiconductor devices become more and more minute and highly integrated, surface topography of substrates under processing, which are on the way of the manufacturing process, tends to become more uneven. Therefore, planarization of the surface of substrates under processing at each step of manufacturing has come to take on great technical importance. As one example of step to planarize the film formed on a semiconductor wafer with an uneven surface in a process for the manufacturing of semiconductor devices, a metalization step wilt be described below with reference to FIGS. 1(a) through 1(f).

FIG. 1(a) illustrates a cross-sectional view of a wafer substrate 1 on which a first metalized layer 3 consisting of aluminum or the like is formed via a dielectric film 2. Incidentally, though not shown, a transistor part is formed on the surface of the wafer substrate 1. As an opening part is disposed in the dielectric film 2 in a connecting part between the first metalized layer 3 and the transistor, the metalized layer in that part 3' has a dent. FIG. 1(b) shows a cross-sectional view of a wafer after the completion of the metalization of a second layer. A dielectric film 4 and an aluminum film 5, which will constitute a second metalized layer, are successively formed over the first metalized layer 3 and, further, in order to make the aluminum film 5 a metalized layer having a desired pattern, which is then coated with a photo resist film 6 for exposure. Next, as shown in FIG. 1(c), using a stepper 7, the above-mentioned photo resist film 6 is exposed to light to give it a circuit pattern. During this processing, if a difference in level between a reentrant and a salient 8 on the photo resist film 6 is greater than the depth of focus of the exposure unit, no simultaneous focusing on the reentrant and the salient will be possible, inviting a serious disadvantage of defocusing.

In order to obviate the above-mentioned disadvantage, planarization of the substrate surface is performed as described below. Following the process of FIG. 1(a), as shown in FIG. 1(d), after the dielectric film 4 is formed, according to a method described later, polishing is performed to planarize the film 4 to the level indicated by reference numeral 9 in FIG. 1(d), and the state of FIG. 1(e) is there attained. Subsequently, the aluminum film 5, which will constitute the second metalized layer, and the photo resist film 6 are formed, and exposed by the stepper 7 as shown in FIG. 1(f). In this state, since the photo resist film surface is planarized, the above-mentioned disadvantage of defocusing does not arise.

FIG. 2 shows the chemical mechanical polishing (CMP) method, which has been generally used for the planarization of the above-mentioned dielectric film 4. A polishing pad 11 is attached to a platen 12 and kept rotating. This polishing pad 11 may consist of, for example, a pad that is formed by slicing polyurethane foam resin into a thin sheet, whose material and minute surface configuration may be selected according to the type of the object of polishing or the degree of desired surface roughness. On the other hand, the wafer 1 to be polished is fixed to a wafer holder 14 via a resilient backing pad 13. While rotating this wafer holder 14, the surface of the polishing pad 11 is loaded and, further by supplying a polishing slurry 15 onto the polishing pad 11, the salients of the dielectric film 4 on the wafer surface are eliminated by polishing to planarize its surface.

When a dielectric film of silicon dioxide or the like is to be polished, fumed silica is usually used as polishing slurry. Fumed silica is a suspension of minute silica particles of about 30 nm in diameter in an alkali aqueous solution such as potassium hydroxide, and it is characterized by its far higher removal rate and the smoother surface it gives with less processing damage than simple mechanical polishing with only abrasives by virtue of the additional chemical action of alkali. Such a processing method involving the supply of polishing slurry between the polishing pad and the object to be polished is well known as a free abrasive polishing technique.

FIG. 3 shows a planarization processing method using a fixed abrasive tool. This method is similar in basic hardware configuration to the free abrasive polishing technique using a polishing pad excepted that a fixed abrasive tool 16 is mounted on a rotating platen instead of the polishing pad. This process can as well be accomplished even with the supply of mere water containing no abrasives instead of fumed silica or the like as polishing liquid. Incidentally, the present inventors are studying on their own the technique that uses a fixed abrasive tool on the way of a manufacturing process for semiconductor devices, and this is no publicly known art.

This technique involves the disadvantages described below when it is applied to a practical semiconductor manufacturing process whether a polishing pad or a fixed abrasive tool is used for polishing. First, the removal rate of the polishing apparatus is too low to work on a sufficiently large number of wafers per hour (throughput). A conventional CMP apparatus with an average throughput capacity can process 20 pieces or so per hour, and this capacity is lower than those of other semiconductor manufacturing apparatuses used in other steps of the process. For this reason, when CMP apparatuses are to be introduced into the manufacturing line, a greater number of such apparatuses should be installed than otherwise to make up for their low throughput, resulting in an increased manufacturing cost. The Japanese Patent Laid-Open Publications Nos. 56-134170 and 60-25649 disclose techniques, intended to raise the throughput, to polish an object vertically fixed to allow the upper and lower exposed faces simultaneously with pieces of polishing cloth disposed above and below. However, the apparatuses disclosed in these publications are used for polishing a single material, with no consideration for the polishing of a film that is formed on a substrate with an uneven surface. Incidentally, unevenness in this context refers to a difference in level of 100 nm or more.

The poor controllability of the currently used CMP process also poses a problem in the semiconductor manufacturing process. The values of basic parameters of the process, such as the polishing rate and the within wafer and wafer to wafer uniformities of the amount of work done tend to fluctuate, and it is not easy to keep them within their respectively prescribed ranges. This mainly results from the deformation and deterioration of the surface of the polishing pad surface or fixed abrasive tool used for polishing along with the progress of processing. For this reason, every time a predetermined number of wafers have been processed, the working surface of the polishing pad or the fixed abrasive tool is revamped, which is called dressing. Usually, dressing is performed by pressing a ring having diamond abrasive on it or a disk-shaped tool against the polishing tool, and the processing tool surface is thereby restored to a state in which the polishing liquid can be readily held. Although an acceptable polishing rate can be recovered by dressing, the polishing processing tool itself wears out and becomes deformed all over while dressing is repeated over and over again, and the within wafer uniformity of the amount of work done cannot be maintained. It is because the construction of the dressing tool is not suitable for performing uniform dressing over the whole surface of the polishing pad or fixed abrasive tool, which is larger than the dressing tool. Under the present circumstances, there is the problem of difficulty to maintain the polishing rate and the planarity of the processing tool itself both at a satisfactory level.

Another reason for the difficulty to uniformize the amount of work done within the wafer is that, besides the problem with the above-mentioned dressing technique, the supply of processing liquid is uneven. Currently, the liquid used for processing is supplied from outside the wafer while it is being worked upon, resulting in a difference in supply quantity between the outer and central regions of the wafer. While the wafer diameter will tend to become larger, the larger diameter would invite a further increase in the unevenness of processing liquid supply and in the difficulty to keep the within wafer uniformity of the amount of work done. Also, in order to improve the efficiency of planarizing the wafer surface pattern, processing tools such as polishing pads that are significantly increased in hardness and in the modulus of elasticity are increasingly preferred, but harder polishing tools that yield a better planarization ability usually tend to deteriorate the within wafer uniformity, which would also make it difficult to maintain the within wafer uniformity of the amount of work done. The reason why device planarization by CMP of a wafer is especially more difficult than other polishing processes is that it is required to meet such contradictory requirements that, while only reentrants are selectively planarized at the level of pattern size on the wafer, both the chips which are reentrants and those which are salients at the level of chip size have to be uniformly polished all over the wafer surface.

Another disadvantage is an increase in the floor space the apparatus occupies. Because an increasing number of chips per wafer can reduce the production costs of semiconductor wafers, the diameter of semiconductor wafers tends to become larger. Currently, most semiconductor production facilities manufacture wafers of 200 mm in diameter as standard products, but 300 mm is likely to become a new standard diameter for wafers in the near future. On the other hand, as conventional apparatuses for the polishing process shown in FIGS. 2 and 3 would require a machining tool proportional the wafer size (approximately two to three times the diameter of the wafer) to be set horizontally, accommodating 300 mm or larger wafers which would come about in future would pose the problem that the apparatus occupies too large a floor space to be useful for practical purposes. Configurations for reducing the floor space occupied by the apparatus by vertically arranging the surface to be polished are disclosed in the Japanese Patent Laid-Open Publications Nos. 54-81591 and 4-69161. However, these apparatuses are intended for single-material polishing, but embody no consideration for the need to polish a film formed over a substrate with an uneven surface.

An object of this invention, in order to overcome the above-mentioned disadvantages of the prior art, is to provide a machining method, relating to techniques for use in the manufacturing process of semiconductor integrated circuits for the planarization of wafer surface patterns by polishing, that can accomplish planarization with excellent controllability, highly efficiently and with high qualitative stability, and that is suitable for machining larger diameter wafers as well.

SUMMARY OF THE INVENTION

The above-mentioned object to accomplish planarization with excellent controllability and stability can be achieved by a machining method using a smaller tool whose diameter is not more than twice as large as that of a wafer, and which easily permits high quality dressing and maintains planarity of its working surface. In this case, by polishing the wafer in such a matter that the whole wafer is positioned within the polishing surface of polishing tool, the amount of polishing can be controlled with high accuracy without allowing any defect to occur in the film formed over the wafer having minute asperities. Also, the disadvantage of the low removal rate can be obviated by a machining method by which the wafer is held on both sides of one wafer holder and planarization is performed simultaneously on both sides. Moreover, in order to accomplish high quality planarization, vertical positioning of a polishing tool and the working surface of the wafer holder, instead of using a conventional apparatus with a horizontally positioned polishing tool, and supplying the polishing liquid from the working surface of a polishing tool as well depending on the wafer size serves to facilitate discharging of machining dust, and to spread the polishing liquid all over the tool surface thereby to achieve uniform machining of the whole wafer surface.

As described above, according to this invention, in the polishing of semiconductor wafers, the use of a smaller-diameter machining tool within the range of $d<D<2d$, wherein d is the wafer diameter and D is the diameter of the working surface of the machining tool, makes it easy to maintain a satisfactory degree of planarity for the machining tool, and to achieve a steady polishing rate while ensuring within wafer and wafer to wafer uniformities. Additionally, the machining tool in the polishing apparatus may have a configuration to allow replacement in accordance with the wafer size. Moreover, simultaneous machining of a plurality of wafers on both sides of the wafer holder results in an enhanced throughput of the apparatus and, further, where the machining tool is a fixed abrasive tool, dressing by scrubbing fixed abrasive tools opposite to each makes it possible to maintain a high degree of planarity for the fixed abrasive tool surface without requiring a dressing tool. Furthermore, positioning the machining tool and the wafer vertically facilitates rapid removal of foreign matter or polishing dust on the machining tool, make possible scratch-free machining and, combined with the supply of the polishing liquid from the machining tool surface, ensures uniform supply of the machining liquid to the central part of the wafer, resulting in an enhanced within wafer uniformity of polishing.

The use of the smaller-diameter polishing tool and the vertical positioning help reduce the floor space the apparatus occupies. As a result, it contributes of space efficiency in the limited floor areas of semiconductor plants and, through the space saving, to bringing down the wafer manufacturing costs. Furthermore, if and when wafers to be machined become larger in surface area, the floor space for the apparatus in principle will not increase in proportion to the larger wafer size. Moreover, this method has an advantage in adapting to the increased wafer diameter expected in future, obviously ensuring compatibility with wafers of such a large diameter as 300 mm without needing modification of the fundamental arrangement of the apparatus.

BRIEF DESCRIPTION OF THE DRAWINGS

FIG. 6 is a diagram for describing the derivation of the relative velocity equation between the polishing tool and the wafer.

DESCRIPTION OF THE PREFERRED EMBODIMENTS

Figure 1:
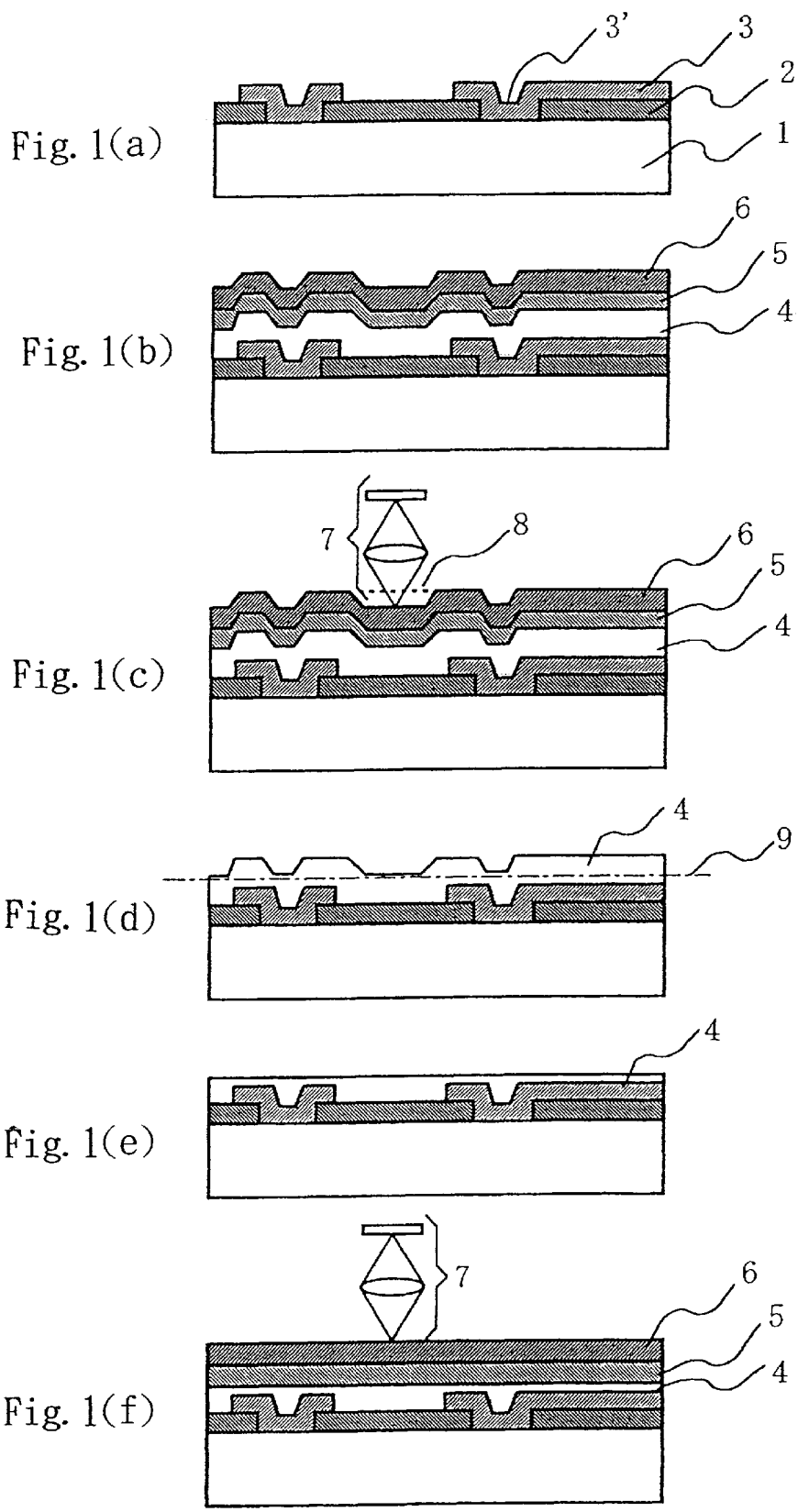
FIGS. 1(a) to 1(f) show sectional views of essential parts of a semiconductor device, illustrating steps of wafer surface planarization.
Figure 2:
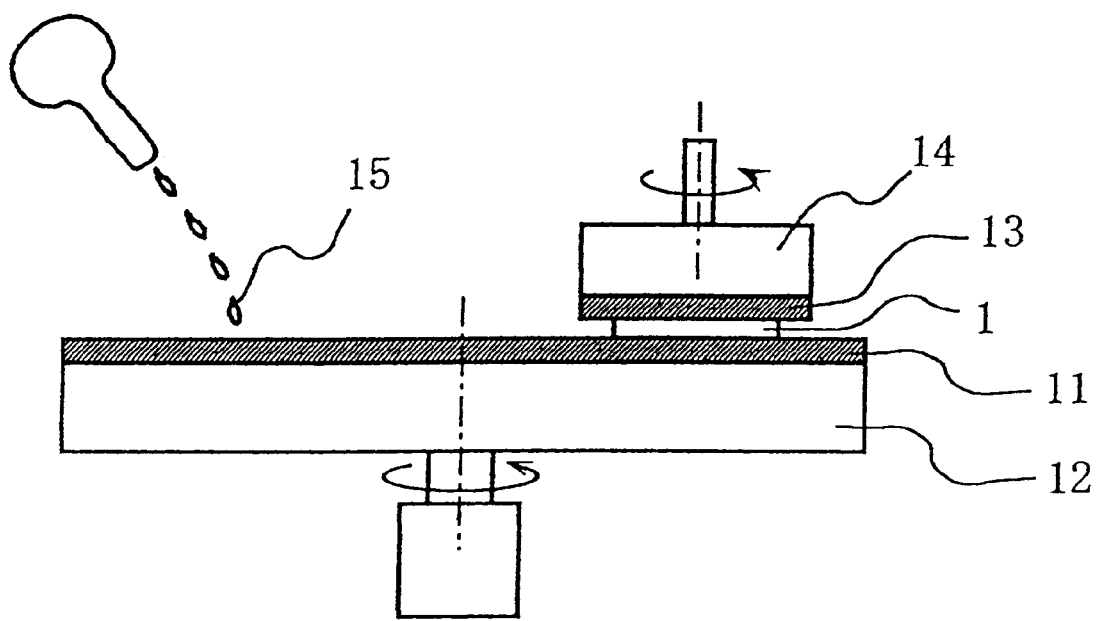
FIG. 2 shows a sectional view of a polishing unit for describing the chemical mechanical polishing method.
Figure 3:
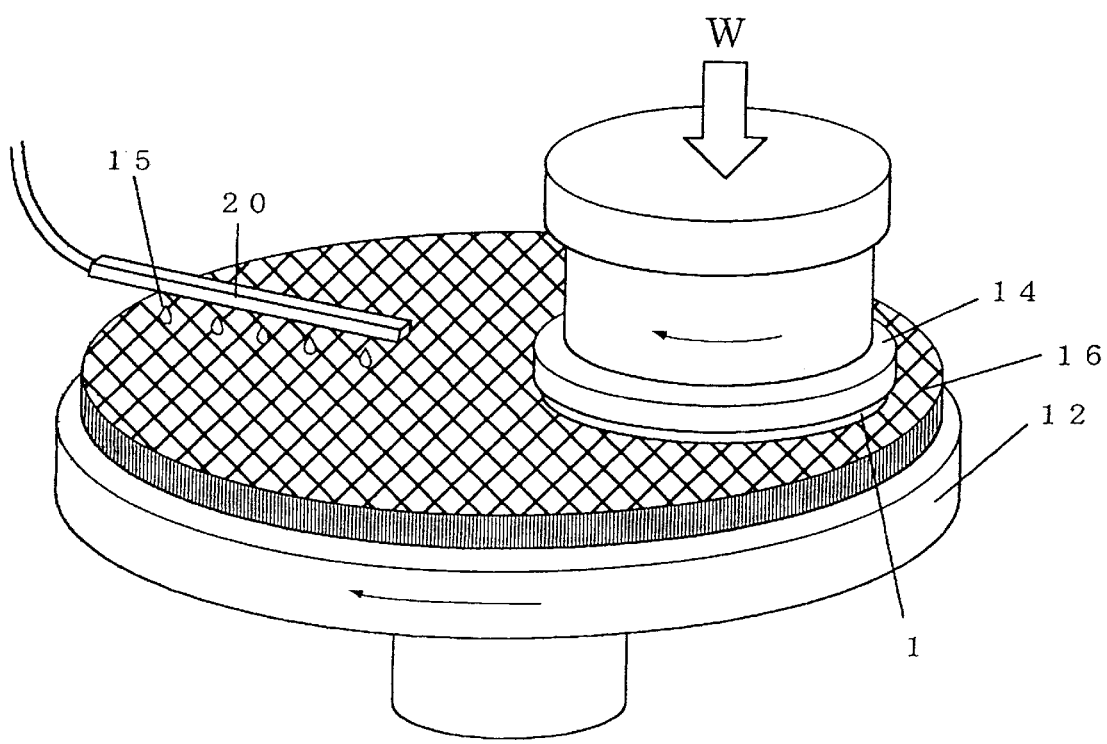
FIG. 3 shows a perspective view of essential parts of a polishing unit with a fixed abrasive tool.
Figure 4:
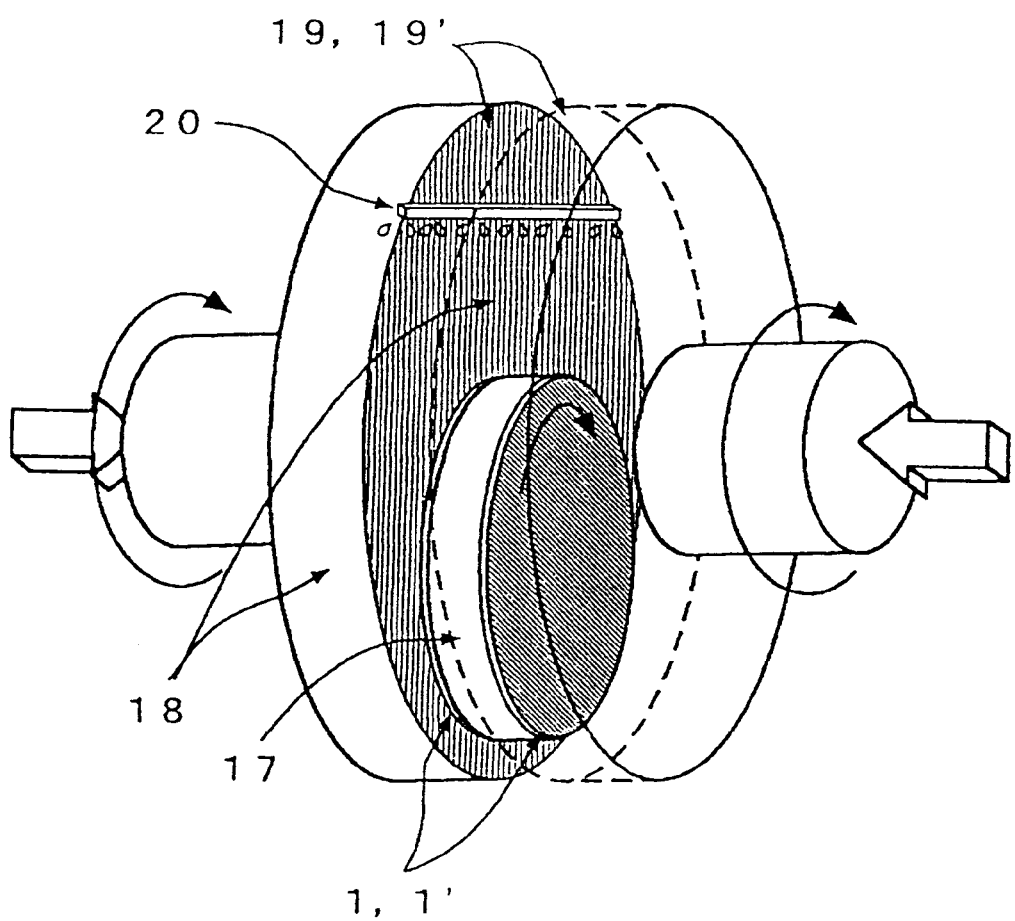
FIG. 4 shows a perspective view of essential parts of a polishing unit according to one embodiment of this invention.

Hereinafter, one embodiment of this invention will be described in detail. FIG. 4 shows a perspective view of essential parts of a polishing unit according to this invention. The unit comprises a wafer holder 17; a pair of platens 18; and polishing tools 19 and 19, each consisting of a polishing pad or a fixed abrasive tool attached to a platen, the wafer holder 17 and the platens 18 being driven by an external motor to rotate within a plane vertical to the floor. In FIG. 4, for the sake of simplicity, illustration of arms and the motor supporting and driving the wafer holder 17 is dispensed with. Two wafers 1 and 1', held by the wafer holder 17, are pressed against the polishing tools 19, 19 respectively, and both the wafers and the tools are rotated in the same direction. When these motions take place, the velocities of all the points on the wafers against relative to the polishing tool are equal, so that the whole wafer surface to be processed is uniformly polished and planarized. The reason will be described later.

During polishing, polishing liquid is supplied by a polishing liquid supply unit 20 from above the wafer. Although not shown in FIG. 4, the processing liquid is also supplied from grooves disposed on the working surface of the polishing tools 19 and 19 depending on the wafer size. The grooves should preferably be arranged in a grid with a pitch of preferably 10 to 20 mm.

Where the diameter of the semiconductor wafers exceeds 200 mm, the polishing liquid is supplied from the above-mentioned grooves. By making the supplied amount of the polishing liquid variable according to the wafer size, much greater accuracy of polishing can be achieved. Alternatively, the polishing liquid supply unit can be built into a retainer ring, disposed to surround the wafer peripheries in the wafer holder 17. Whichever arrangement is chosen, this unit is structured to force the polishing liquid to be removed from the polishing surface by gravity during polishing, thereby facilitating constant supply of new polishing liquid, reducing the loading of the polishing tools, and promptly reducing the polishing dust and foreign matter which tend to invite polishing scratches. Furthermore, as the polishing liquid is supplied from the tool surface, a sufficient quantity of the polishing liquid can be provided to the central part of each wafer, where the polishing liquid could not adequately access the conventional process. Further, by flowing aqua pura flown from the above-mentioned grooves or holes after the wafers are polished, the polishing liquid can be quickly removed.

Here in this embodiment, the diameter of the polishing tool 19 is only about 1.8 times as large as that of the wafers 1 and 1. The use of such small diameter polishing tools facilitates dressing to maintain the planarity of the tools. In connection with the use of smaller polishing tools, the positions of the rotational axes of each tool and each wafer are brought closer to each other, and this arrangement, if it is left as it is, the relative velocity between the tool and the wafer will decrease, adversely affecting the efficiency of polishing. This can be remedied by increasing the rotational frequencies of the tool and of the wafer holder.

Figure 5:
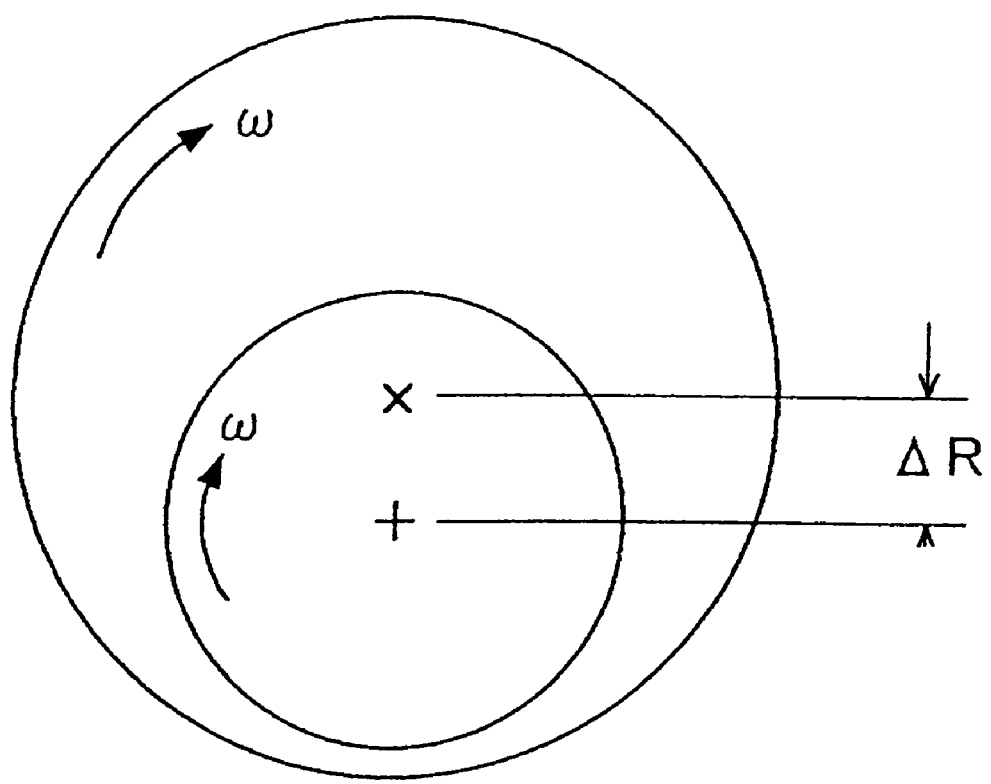
FIG. 5 is a diagram for describing the positional relationship between a polishing tool and a wafer.

Referring to FIG. 5, it will be described below how uniform polishing can be accomplished even where the diameter of the platens is less than two times as large as that of the wafers with reference to the relationship between the tool-wafer relative velocity and the positions of the rotational axes the tool and the wafer. When the polishing tool and the wafer, rotating at the same rotational frequency $\omega$, are positioned to eccentrically as shown in FIG. 5, the absolute value V of the relative velocity between the tool and the wafer at a given point can be represented by $V=R\times\omega$ anywhere on the wafer, where R is the distance between the rotational axes of the wafer and of the polishing tool. FIG. 6 briefly shows how this equation is derived. This relationship holds whether the wafer surface overlies the central point of the polishing tool or not. This means that the reduced effect of R due to the smaller diameter of the polishing tool can be compensated for by increasing the rotational frequency $\omega$ in proportion to the decrease in R. That is, the rotational frequencies of the semiconductor wafer and of the tool are determined by the distance between the rotational centers of the semiconductor wafer and of the working surface of the tool. However, these rotational frequencies have a tolerance of 10 to 20%. In this embodiment, since the distance R between the rotational centers of the semiconductor wafer and the polishing tool is approximately one third to one fourth of that in conventional apparatuses, the shorter distance R can be compensated for by, for example, using a rotational frequency $\omega$ of about 150 rpm.

Figure 7:
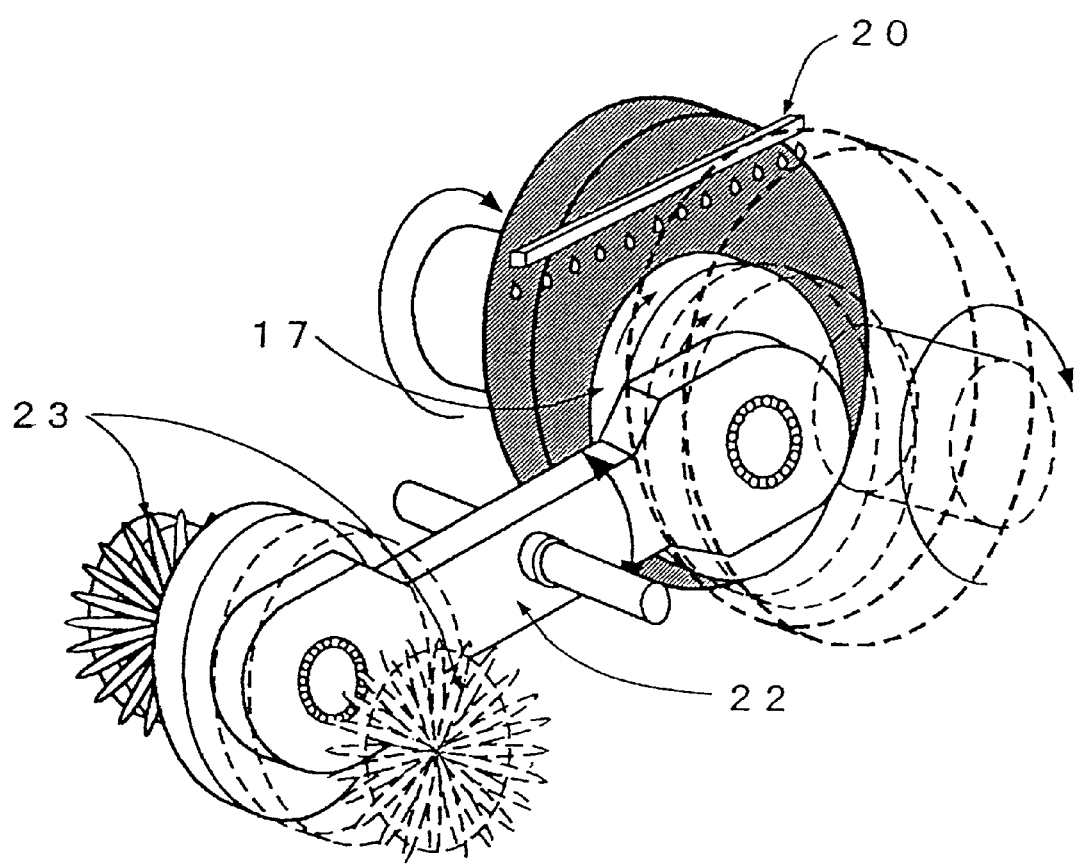
FIG. 7 shows a perspective view of essential parts of a polishing unit according to one embodiment of this invention.

FIG. 7 shows a schematic view of the embodiment, which includes an arm 22 for supporting and driving the wafer holders 17, and a cleaning unit 23. One each of the wafer holders 17 is fitted to each end of the arm 22, and while one wafer holder is held between the fixed platens and polished, the other wafer holder 17 is positioned toward the wafer cleaning unit 23 to perform cleaning. Additionally, since the arm 22 swings within a range of not allowing the wafer holder 17 to substantially deviating from the tool 19 during polishing, the uniformity of polishing can be enhanced.

Figure 8:
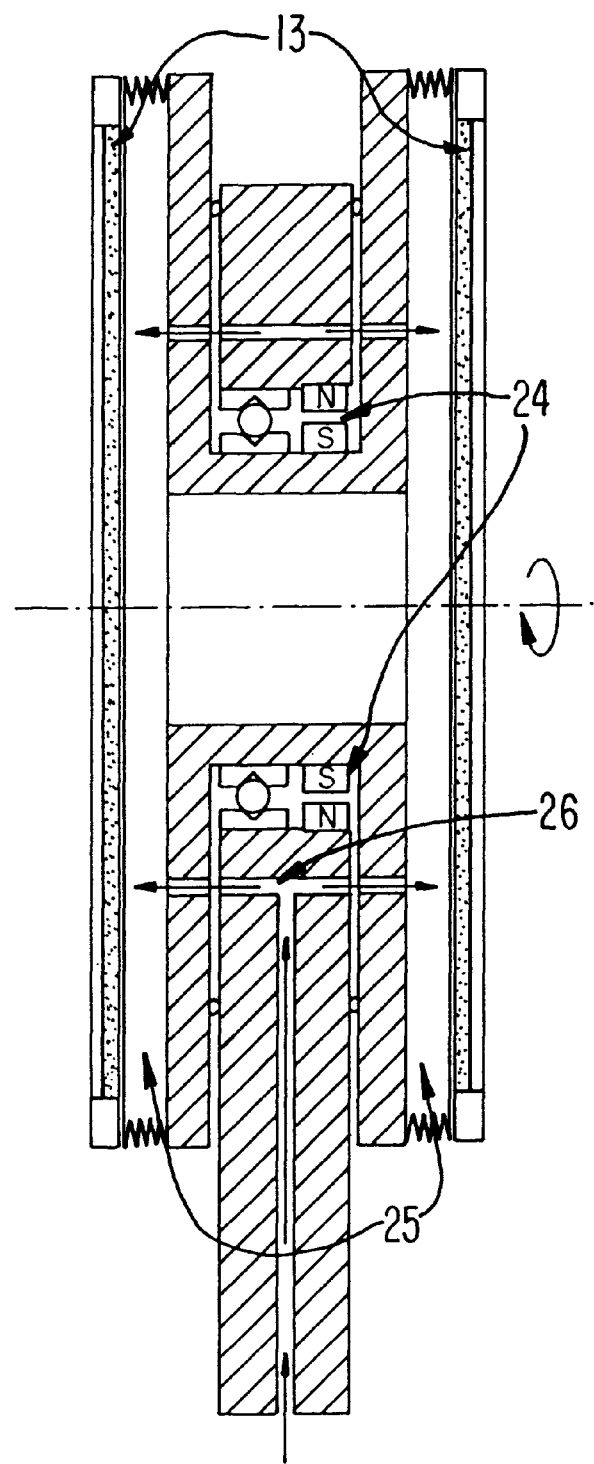
FIG. 8 shows a cross-sectional view of a wafer holder part according to one embodiment of this invention.

FIG. 8 shows a detail view of the wafer holder 17. The wafer holder 17, in which a direct-drive type motor 24 is disposed to turn the wafer holder at a rotational frequency substantially equal to the rotational frequency of the polishing tool during polishing. Backing pads 13 and porous substrates 25 attached thereto are breathable, and they are connected to a vacuum suction unit or a pneumatic pressurizing unit via an air vent 26. By controlling this pneumatic pressure, the wafer can be attracted to or peeled off the backing pad as desired.

Figure 9:
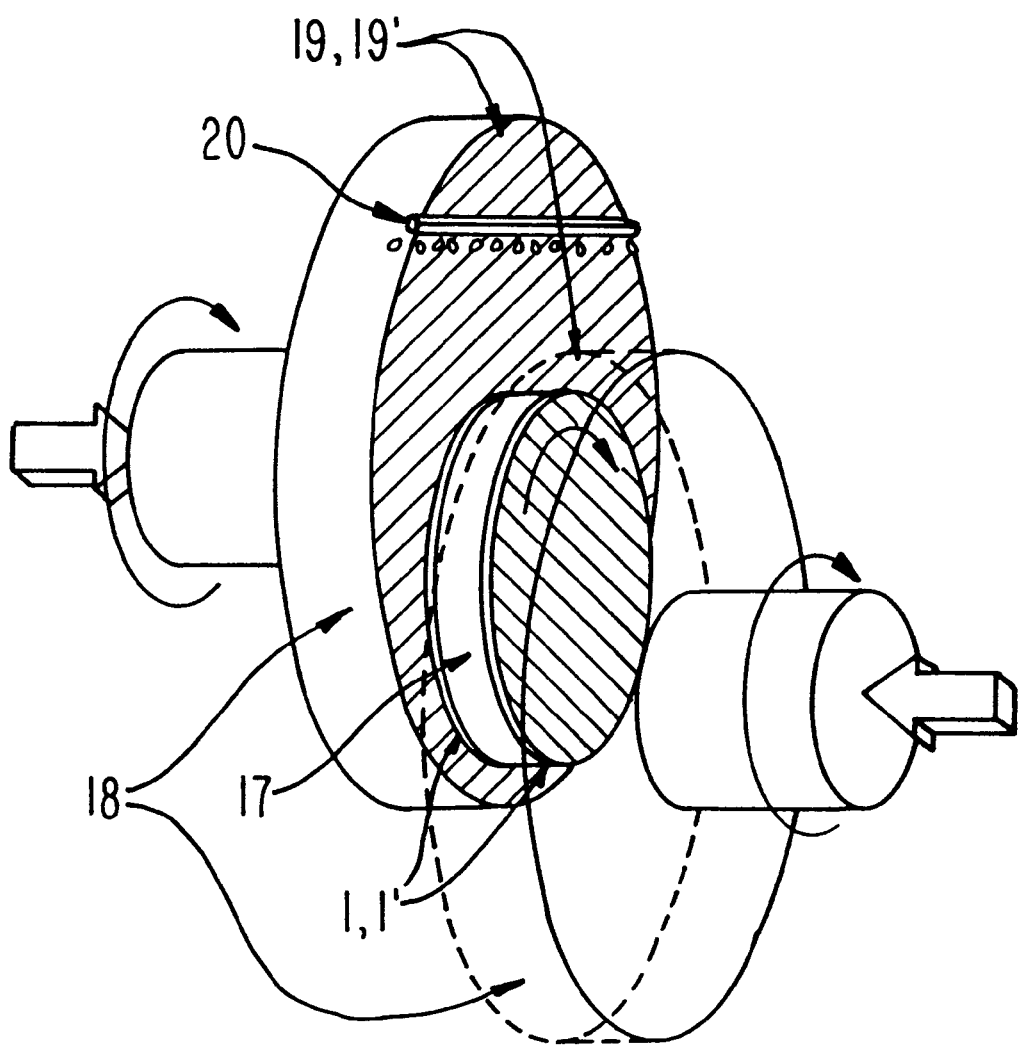
FIG. 9 shows a perspective view of essential parts of a polishing unit according to one embodiment of this invention.

Incidentally, though polishing is performed in the above-described embodiment in an arrangement wherein the rotational axes of two polishing tools are positioned on the same straight line, the rotational axes of the two polishing tools need not be aligned, and polishing may as well be performed in an arrangement with a lag between these rotational axes as shown in FIG. 9. Even in this case, however, the wafers 1 and 1' are positioned within the areas of the working surface of the tools 19 and 19'

Next, FIGS. 10(a) to (e) show one example of manufacturing process wherein a memory cell, consisting of one transistor and one capacitor, is produced in accordance with this invention. Additionally, FIG. 11 shows a top view of the memory cell, and FIGS. 10(a) to (e) show cross sections cut by the line A—A in FIG. 11. Here, 110 denotes a source area; 120, a drain area; 111 and 121, connecting parts to the respective areas; 210; a capacitor lower electrode; 230, a capacitor upper electrode; 106, a bit line; and 141, a gate electrode.

Figure 10A:
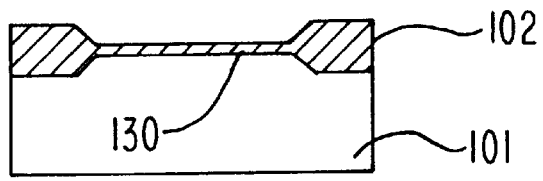
FIGS. 10(a) to 10(e) show cross-sectional views of manufacturing steps for semiconductor memories.
Figure 10B:
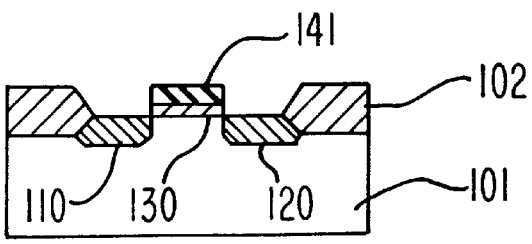
Figure 11:
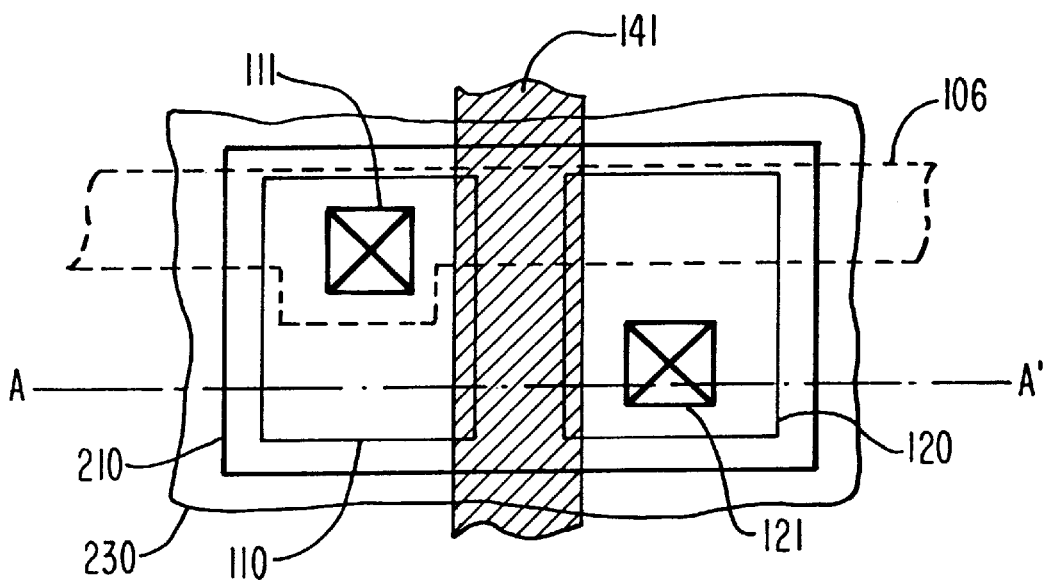
FIG. 11 shows a top view of a semiconductor memory.

FIG. 10(a) shows a cross-sectional view of a p-type silicon substrate 101 after the formation on it, by selective oxidation, of an isolation film 102 consisting of an 800 nm thick silicon dioxide film for electrically isolating memory cells and of a silicon oxide film to constitute a gate dielectric film for an MOS transistor for switching use. After the formation of these layers, in order to control the threshold voltage of the MOS transistor, boron is ion-implanted, and further a polysilicon film to constitute the gate electrode 141 is deposited to a thickness of 300 nm by the chemical vapor deposition (CVD) method. Next, as shown in FIG. 10(b), the gate electrode 141 and the gate dielectric film 130 of the MOS transistor are formed by well-known photoetching. Phosphorus is added to the polysilicon film to make it electroconductive. Then, arsenic is ion-implanted to form the source area 110 and the drain area 120 of the MOS transistor.

Figure 10C:
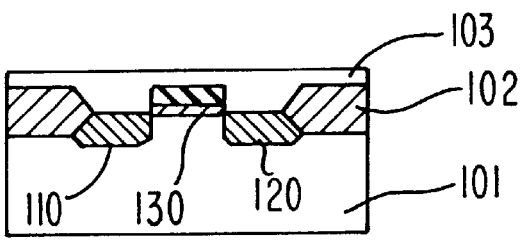

Next, as shown in FIG. 10(c), after a phosphoric glass (PSG) film 103 to constitute an interlayer dielectric film is deposited to a thickness of 500 nm on the substrate surface by the CVD method, polishing for planarization by about 200 nm is performed. Additionally, this polishing is performed with a polishing tool having a working surface whose diameter is about 1.3 times as large as the diameter of the substrate, with two substrates being fixed to one holder so as to expose the substrate surface.

Then, a via hole 111 is bored into the PSG film to form the bit line 106 (FIG. 11).

Figure 10D:
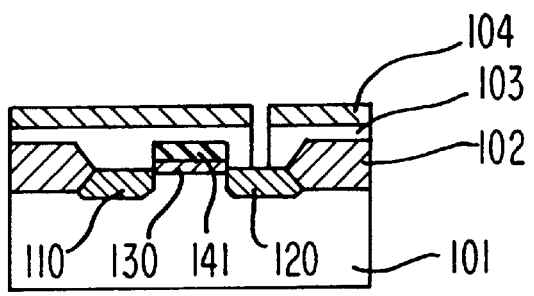
Figure 10E:
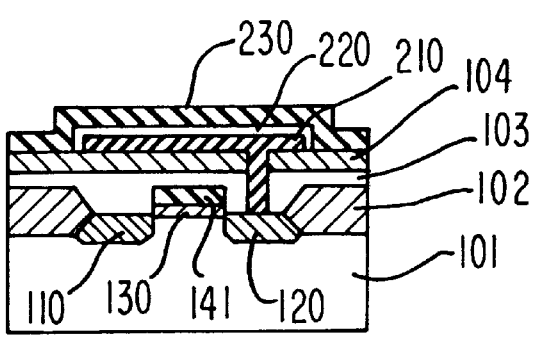

Next, as shown in FIG. 10(d), the PSG film 104 to constitute an interlayer dielectric film is deposited to a thickness of 500 nm by the CVD method, followed by polishing for planarization in the same manner as described above, and further a via hole 121 is formed by photoetching.

Then, a polysilicon film to constitute the capacitor lower electrode 210 is formed by the CVD method and machined into a desired shape. Phosphorus is also added to this polysilicon film to make it electroconductive. Next, a capacitor dielectric film 220 and the capacitor upper electrode 230 are formed over it (FIG. 10(e)).

By the above-described method, memory cell surface can be planarized at higher speed and more accurately than by any conventional method to provide semiconductor devices, which are minute and highly reliable.

Additionally, the polishing method according to this invention is not limited to the above-described method. For example, it can be applied to for dielectric film or metal film processing in the metalization process.

Furthermore, although a pair of polishing tools are combined with one wafer holder in this embodiment, a plurality of wafer holders may be used, or each holder may as well hold two or more wafer during polishing.

What is claimed is:

1. A method of treating a semiconductor wafer having films with uneven surfaces formed over the semiconductor wafer, comprising:

processing the uneven surfaces for planarization thereof, using a processing tool having a working surface, wherein the working surface is disposed vertically, the uneven surfaces are positioned entirely within the periphery of the working surface, and the working surface has a diameter which is less than two times that of the uneven surfaces.

2. A method of treating a semiconductor wafer according to claim 1, wherein said semiconductor wafer is rotated in a same direction as said processing tool during the processing, and the rotational frequency of said semiconductor wafer and that of said processing tool is determined by the distance between a rotational center of said semiconductor wafer and that of the working surface of said processing tool.

3. A method of treating a semiconductor wafer according to claim 1, wherein said semiconductor wafer is processed, using said working surface, with a polishing liquid supplied from a supply unit disposed on the working surface.

4. A method of treating a semiconductor wafer according to claim 1, wherein said semiconductor wafer is processed with a polishing liquid which is supplied from a supply unit disposed on the working surface and whose amount of supply is controlled in accordance with the size of said semiconductor wafer.

5. A method of treating a semiconductor wafer according to claim 1, wherein said processing is polishing.

6. A method of treating a semiconductor wafer according to claim 1, wherein said processing is grinding.

7. A method of treating a semiconductor wafer according to claim 1, wherein the position of the rotational axis of said semiconductor wafer is swung relative to the position of the rotational axis of said processing tool.

8. A method of treating a semiconductor wafer according to claim 1, wherein the semiconductor wafer has a plurality of transistors thereon, and has a plurality of films thereover forming said uneven surfaces.

9. A method of treating semiconductor wafers having films with uneven surfaces formed over the semiconductor wafers, comprising:

processing the uneven surfaces for planarization thereof, using a processing tool having a working surface, wherein the working surface is disposed vertically, and two semiconductor wafers are respectively held on two sides of a wafer holder so as to expose the films of the two semiconductor wafers, the films of the two semiconductor wafers being planarized in identical processes.

10. A method of treating semiconductor wafers according to claim 9, wherein each semiconductor wafer is rotated in a same direction as said processing tool, and the rotational frequency of said semiconductor wafer and that of said processing tool is determined by the distance between a rotational center of said semiconductor wafer and that of the working surface of said processing tool.

11. A method of treating semiconductor wafers according to claim 9, wherein each semiconductor wafer is processed by said working surface with a polishing liquid supplied from a supply unit disposed on the working surface.

12. A method of treating semiconductor wafers according to claim 9, wherein each semiconductor wafer is processed with a polishing liquid which is supplied from a supply unit disposed on the working surface and whose amount of supply is controlled in accordance with the size of said semiconductor wafer.

13. A method of treating semiconductor wafers according to claim 9, wherein said processing is polishing.

14. A method for processing semiconductor wafers according to claim 9, wherein said processing is grinding.

15. A method for processing semiconductor wafers according to claim 9, wherein the position of the rotational axis of each semiconductor wafer is swung relative to the position of the rotational axis of said processing tool.

16. A method of treating semiconductor wafers according to claim 9, wherein each semiconductor wafer has a plurality of transistors thereon, and has a plurality of films thereover forming said uneven surfaces.

* * * * *